(12) United States Patent
Miyazaki et al.

(10) Patent No.: US 12,308,349 B2
(45) Date of Patent: May 20, 2025

(54) SEMICONDUCTOR APPARATUS

(71) Applicant: Mitsubishi Electric Corporation, Tokyo (JP)

(72) Inventors: Takamasa Miyazaki, Tokyo (JP); Keisuke Eguchi, Tokyo (JP)

(73) Assignee: Mitsubishi Electric Corporation, Tokyo (JP)

( * ) Notice: Subject to any disclaimer, the term of this patent is extended or adjusted under 35 U.S.C. 154(b) by 450 days.

(21) Appl. No.: 17/736,422

(22) Filed: May 4, 2022

(65) Prior Publication Data

US 2023/0108305 A1 Apr. 6, 2023

(30) Foreign Application Priority Data

Oct. 1, 2021 (JP) .................................. 2021-162546

(51) Int. Cl.
*H01L 23/00* (2006.01)
*H01L 23/373* (2006.01)
*H01L 25/07* (2006.01)

(52) U.S. Cl.
CPC ........ *H01L 25/072* (2013.01); *H01L 23/3735* (2013.01); *H01L 24/48* (2013.01); *H01L 2224/48227* (2013.01)

(58) Field of Classification Search
CPC ... H01L 25/072; H01L 23/3735; H01L 24/48; H01L 2224/48227; H01L 24/06; H01L 24/49; H01L 2224/0603; H01L 2224/4901; H01L 2224/49111; H01L 2224/49175; H01L 2924/00014; H01L 2924/19107; H01L 25/18; H02M 7/003
See application file for complete search history.

(56) References Cited

U.S. PATENT DOCUMENTS

| 2013/0009291 A1 | 1/2013 | Kim et al. | |
| 2018/0241319 A1* | 8/2018 | Bando | ..................... H01L 25/18 |
| 2020/0052900 A1* | 2/2020 | Qiu | ........................... H04L 9/16 |

FOREIGN PATENT DOCUMENTS

| JP | H03-156964 A | 7/1991 |
| JP | 2013-016766 A | 1/2013 |

OTHER PUBLICATIONS

An Office Action; "Notice of Reasons for Refusal," mailed by the Japanese Patent Office on Aug. 20, 2024, which corresponds to Japanese Patent Application No. 2021-162546 and is related to U.S. Appl. No. 17/736,422; with English language translation.

* cited by examiner

*Primary Examiner* — Elias Ullah
(74) *Attorney, Agent, or Firm* — Studebaker Brackett PLLC

(57) ABSTRACT

A semiconductor apparatus includes: an insulating substrate; a plurality of power semiconductor devices arranged in line on the insulating substrate; and a plurality of control semiconductor devices arranged in line on the insulating substrate so as to face the plurality of power semiconductor devices respectively and driving the plurality of power semiconductor devices, wherein the control semiconductor devices at both ends of the plurality of control semiconductor devices arranged in line are arranged closer to the corresponding power semiconductor devices than the control semiconductor devices which are other than the control semiconductor devices at both ends.

20 Claims, 10 Drawing Sheets

SEMICONDUCTOR APPARATUS

BACKGROUND OF THE INVENTION

Field

The present disclosure relates to a semiconductor apparatus.

Background

A semiconductor apparatus has been proposed in which a trench is formed on a base substrate between a region where a power semiconductor device is mounted and a region where a control semiconductor device is mounted (see Japanese Patent Laid-Open No. 2013-16766). This can prevent thermal interference from the power semiconductor device to the control semiconductor device. It is therefore possible to average a junction temperature of each control semiconductor device and thereby to improve controllability of the semiconductor apparatus.

SUMMARY

Unfortunately, forming a trench on the base substrate can produce a crack on the base substrate, which degrades reliability of the semiconductor apparatus.

The present disclosure has been made to solve the problem as described above, and an object of the present disclosure is to provide a semiconductor apparatus capable of improving controllability without degrading reliability.

A semiconductor apparatus according to the present disclosure includes: an insulating substrate; a plurality of power semiconductor devices arranged in line on the insulating substrate; and a plurality of control semiconductor devices arranged in line on the insulating substrate so as to face the plurality of power semiconductor devices respectively and driving the plurality of power semiconductor devices, wherein the control semiconductor devices at both ends of the plurality of control semiconductor devices arranged in line are arranged closer to the corresponding power semiconductor devices than the control semiconductor devices which are other than the control semiconductor devices at both ends.

In the present disclosure, the control semiconductor devices at both ends of the plurality of control semiconductor devices arranged in line are arranged closer to the corresponding power semiconductor devices than the control semiconductor devices which are other than the control semiconductor devices at both ends. This can average the junction temperatures of the plurality of control semiconductor devices, so that it is possible to reduce variation in the signal transmission times of the control semiconductor devices and thereby improve controllability of the semiconductor apparatus. Further, it is not necessary to form a trench on the insulating substrate to prevent thermal interference from the power semiconductor devices to the control semiconductor devices, so that it is possible to prevent reliability of the semiconductor apparatus from degrading due to a crack being generated on the insulating substrate.

Other and further objects, features and advantages of the invention will appear more fully from the following description.

DESCRIPTION OF EMBODIMENTS

A semiconductor apparatus according to the embodiments of the present disclosure will be described with reference to the drawings. The same components will be denoted by the same symbols, and the repeated description thereof may be omitted.

First Embodiment

Figure 1:
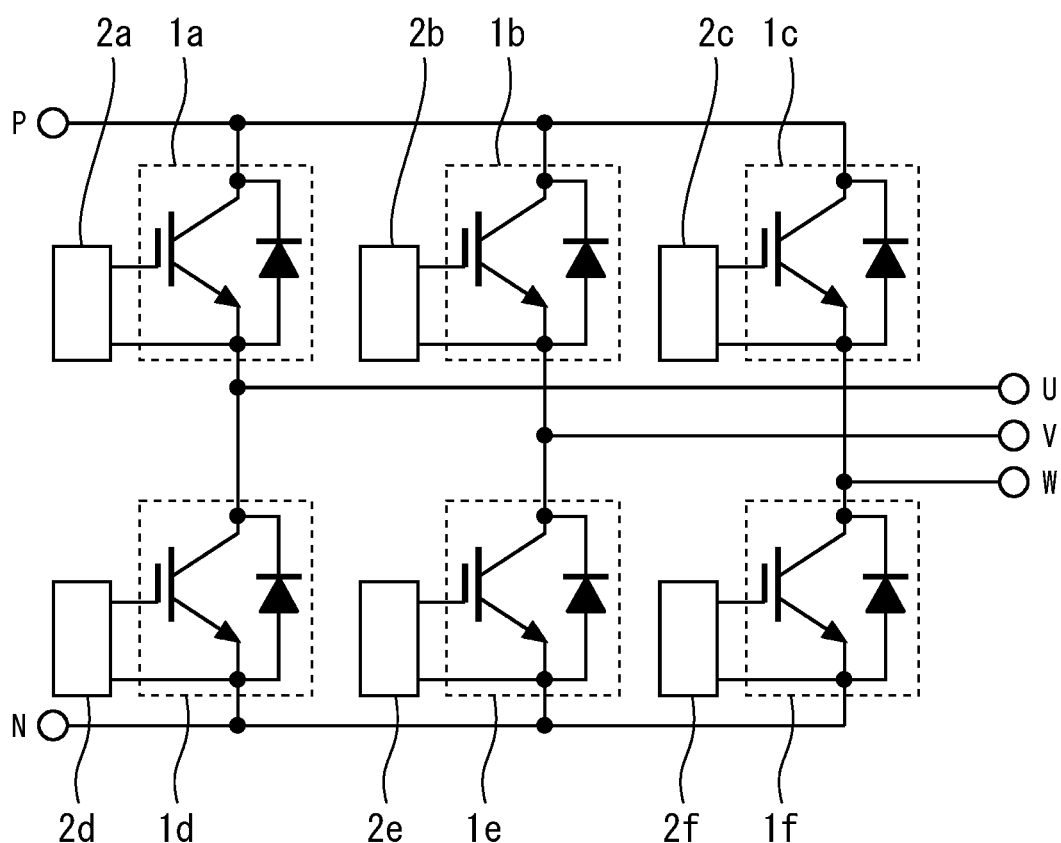
FIG. 1 is a diagram illustrating an equivalent circuit diagram of a semiconductor apparatus according to the first embodiment.

FIG. 1 is a diagram illustrating an equivalent circuit diagram of a semiconductor apparatus according to the first embodiment. This semiconductor apparatus is a three-phase inverter including high side power semiconductor devices 1a to 1c and low side power semiconductor devices 1d to 1f. A plurality of control semiconductor devices 2a to 2f drive the plurality of power semiconductor devices 1a to 1f in accordance with a control signal from outside. Each of the power semiconductor devices 1a to 1f is an RC-IGBT in which an IGBT and a freewheeling diode are integrated into one chip. Each of the power semiconductor devices 1a to 1f is not limited to this, and an IGBT and a freewheeling diode may be formed on separate chips. Each of the power semiconductor devices 1a to 1f may be a MOSFET in which a diode is incorporated. If each of the power semiconductor devices 1a to 1f is a SiC-MOSFET, the semiconductor apparatus can operate at a high temperature.

Gate electrodes of the plurality of power semiconductor devices 1a to 1f are connected to outputs of the plurality of control semiconductor devices 2a to 2f. The high side power semiconductor devices 1a to 1c include collector electrodes connected to a P terminal and include emitter electrodes connected to a U terminal, a V terminal and a W terminal. The low side power semiconductor devices 1d to 1f include collector electrodes connected to the U terminal, the V terminal and the W terminal and include emitter electrodes connected to an N terminal.

Figure 2:
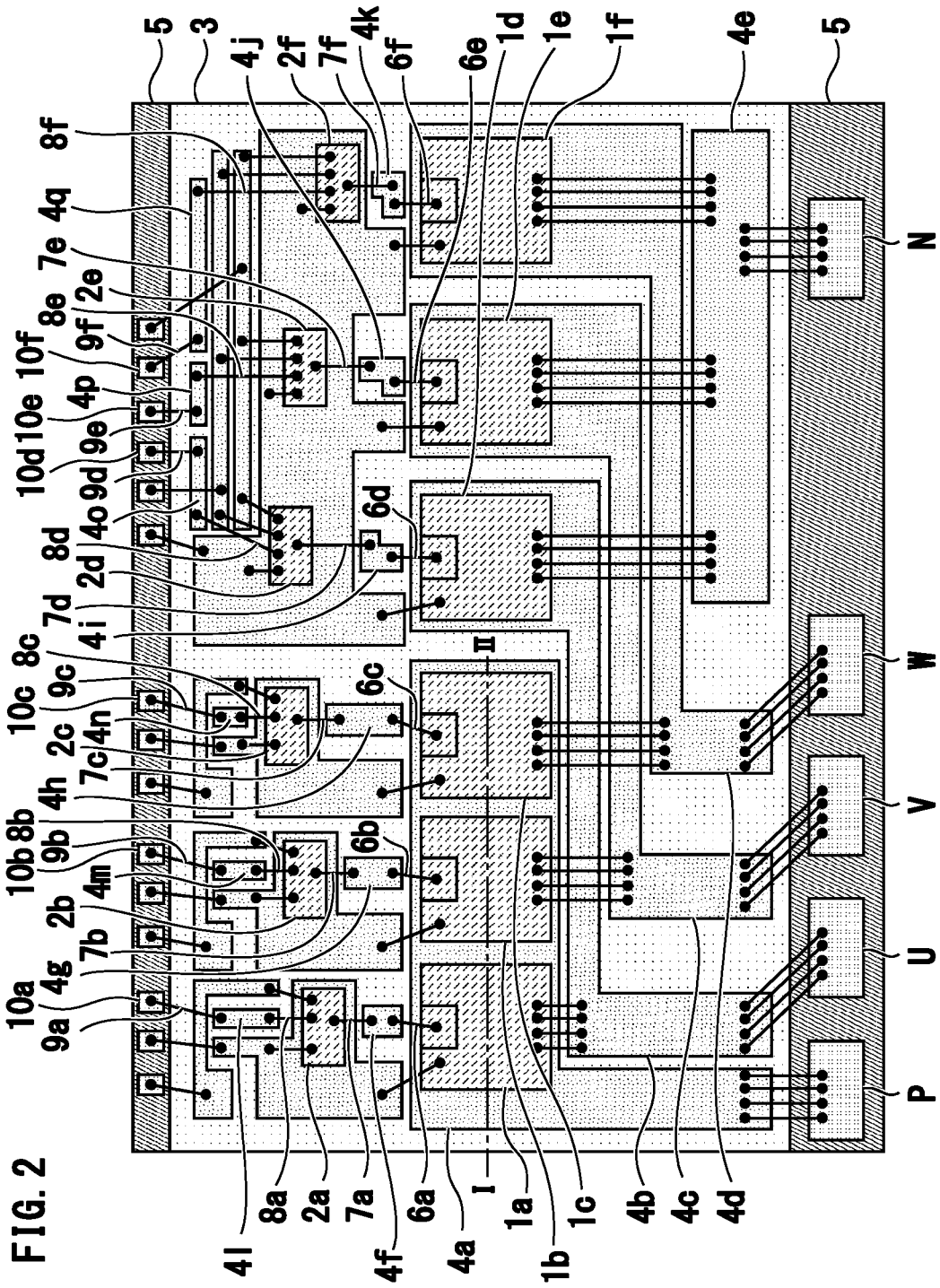
FIG. 2 is a top view illustrating the semiconductor apparatus according to the first embodiment.

FIG. 2 is a top view illustrating the semiconductor apparatus according to the first embodiment. Copper circuit patterns 4a to 4q are provided on an insulating substrate 3. While the insulating substrate 3 is, for example, a resin-insulated copper base plate in which a copper base plate and an insulating layer are integrated together, the insulating substrate 3 may be a ceramic substrate. The periphery of the copper circuit patterns 4a to 4q is surrounded by an insulating case 5 on the insulating substrate 3. The P terminal, the U terminal, the V terminal, the W terminal and the N terminal which are main electrodes and control terminals 10a to 10f are attached to the case 5.

The power semiconductor devices 1a to 1c are mounted on the copper circuit pattern 4a on the insulating substrate 3, and the power semiconductor devices 1d to 1f are mounted on the copper circuit patterns 4b to 4d on the insulating substrate 3. The collector electrodes on lower surfaces of the power semiconductor devices 1a to 1c are bonded to the copper circuit pattern 4a, and the collector electrodes on lower surfaces of the power semiconductor devices 1d to 1f are bonded to the copper circuit patterns 4b to 4d. The emitter electrodes on upper surfaces of the power semiconductor devices 1a to 1c are wire-connected to the copper circuit patterns 4b to 4d. The emitter electrodes on upper surfaces of the power semiconductor devices 1d to 1f are wire-connected to the copper circuit pattern 4e. The copper circuit patterns 4a to 4e are wire-connected to the P terminal, the U terminal, the V terminal, the W terminal and the N terminal.

The control semiconductor devices 2a to 2f are mounted on the copper circuit patterns on the insulating substrate 3 with soldering, an Ag paste or a Si adhesive. Signal pads of the power semiconductor devices 1a to 1f are connected to gate electrodes and connected to one ends of the copper circuit patterns 4f to 4k with signal wires 6a to 6f. Other ends of the copper circuit patterns 4f to 4k are connected to the control semiconductor devices 2a to 2f with signal wires 7a to 7f.

The control semiconductor devices 2a to 2f are connected to one ends of the copper circuit patterns 4l to 4q with signal wires 8a to 8f. Other ends of the copper circuit patterns 4l to 4q are connected to the control terminals 10a to 10f with signal wires 9a to 9f.

The plurality of power semiconductor devices 1a to 1f are arranged in line. The plurality of control semiconductor devices 2a to 2f are arranged in line on the insulating substrate so as to face the plurality of power semiconductor devices 1a to 1f respectively. The control semiconductor devices 2a and 2f at both ends of the plurality of control semiconductor devices 2a to 2f arranged in line are arranged closer to the corresponding power semiconductor devices than the control semiconductor devices 2b to 2e which are other than the control semiconductor devices 2a and 2f at both ends. In other words, the distances between the control semiconductor devices 2a and 2f at both ends and the corresponding power semiconductor devices 1a and 1f are shorter than the distances between the control semiconductor devices 2b to 2e which are other than the control semiconductor devices 2a and 2f at both ends, and the corresponding power semiconductor devices 1b to 1e. Note that arrangement of the control semiconductor devices 2a to 2f may be adjusted in accordance with increased temperatures of the power semiconductor devices 1a to 1f while the above-described relationship is maintained.

Subsequently, inverter operation of the semiconductor apparatus will be described. It is common in the inverter operation that temperatures of power semiconductor devices closer to the center become higher due to thermal interference because the power semiconductor devices 1a to 1f in the respective phases are alternately energized. Thus, in the inverter operation of the semiconductor apparatus, the increased temperatures of the power semiconductor devices 1a and 1f arranged at both ends are lower than the increased temperature of the power semiconductor device 1c arranged at the center. Heat is transferred from the power semiconductor devices 1a to 1f whose temperatures rise to the control semiconductor devices 2a to 2f.

Subsequently, effects of the present embodiment will be described. In a case where distances between the control semiconductor devices 2a to 2f and the corresponding power semiconductor devices 1a to 1f are uniform, the junction temperatures of the control semiconductor devices 2a and 2f at both ends become relatively lower by the temperature difference described above. Signal transmission times of the control semiconductor devices become shorter as the junction temperatures becomes lower. Thus, signal transmission times of the control semiconductor devices 2a to 2f vary due to variation in junction temperatures of the plurality of control semiconductor devices 2a to 2f, which distorts an output voltage of the semiconductor apparatus. This results in erroneous operation of an external load such as a motor connected on an output side of the semiconductor apparatus, leading to degradation in controllability of the semiconductor apparatus.

Thus, in the present embodiment, the control semiconductor devices 2a and 2f at both ends of the plurality of control semiconductor devices 2a to 2f arranged in line are arranged closer to the corresponding power semiconductor devices 1a and 1f than the control semiconductor devices 2b to 2e which are other than the control semiconductor devices 2a and 2f at both ends. This can average the junction temperatures of the plurality of control semiconductor devices 2a to 2f, so that it is possible to reduce variation in the signal transmission times of the control semiconductor devices 2a to 2f and thereby improve controllability of the semiconductor apparatus. Further, it is not necessary to form a trench on the insulating substrate 3 to prevent thermal interference from the power semiconductor devices 1a to 1f to the control semiconductor devices 2a to 2f, so that it is possible to prevent reliability of the semiconductor apparatus from degrading due to a crack being generated on the insulating substrate 3.

Still further, of the plurality of power semiconductor devices 1a to 1f arranged in line, the increased temperatures of the power semiconductor devices 1b and 1e arranged between the power semiconductor device 1c at the center and the power semiconductor devices 1a and 1f at both ends become higher than the increased temperatures of the power semiconductor devices 1a and 1f at both ends and lower than the increased temperature of the power semiconductor device 1c at the center. Thus, the control semiconductor devices 2b and 2e arranged between the control semiconductor device 2c at the center and the control semiconductor devices 2a and 2f at both ends of the plurality of control semiconductor devices 2a to 2f arranged in line are arranged farther from the corresponding power semiconductor devices than the control semiconductor devices 2a and 2f at both ends and closer to the corresponding power semiconductor devices than the control semiconductor device 2c at the center. This can further average the junction temperatures of the plurality of control semiconductor devices 2a to 2f, so that it is possible to further reduce variation in the signal transmission times of the control semiconductor devices 2a to 2f and thereby further improve controllability of the semiconductor apparatus.

Figure 3:
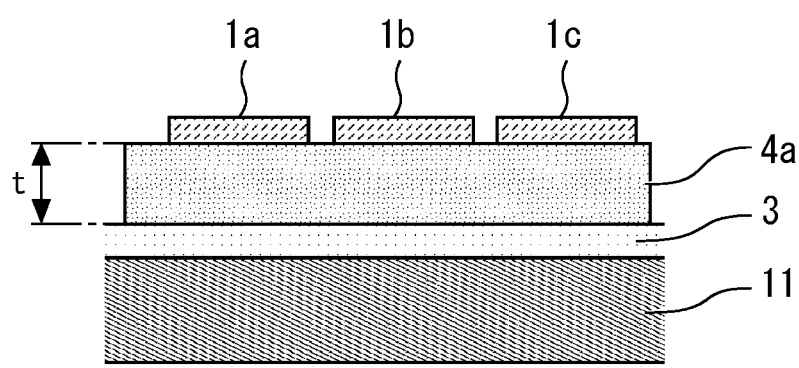
FIG. 3 is a cross-sectional diagram along I-II in FIG. 2.

FIG. 3 is a cross-sectional diagram along I-II in FIG. 2. The insulating substrate 3 is provided on the copper base plate 11. The copper circuit pattern 4a is provided on the insulating substrate 3. The power semiconductor devices 1a to 1c are provided on the copper circuit pattern 4a. It is known that if a thickness of the copper circuit pattern increases by 0.15 mm, a temperature of the copper circuit pattern is lowered by approximately 10° C. On the basis of this result, a thickness t of the copper circuit pattern 4a is set at 0.3 mm or more. This can improve heat dissipation of the semiconductor apparatus, so that reliability of the semiconductor apparatus is improved.

Figure 4:
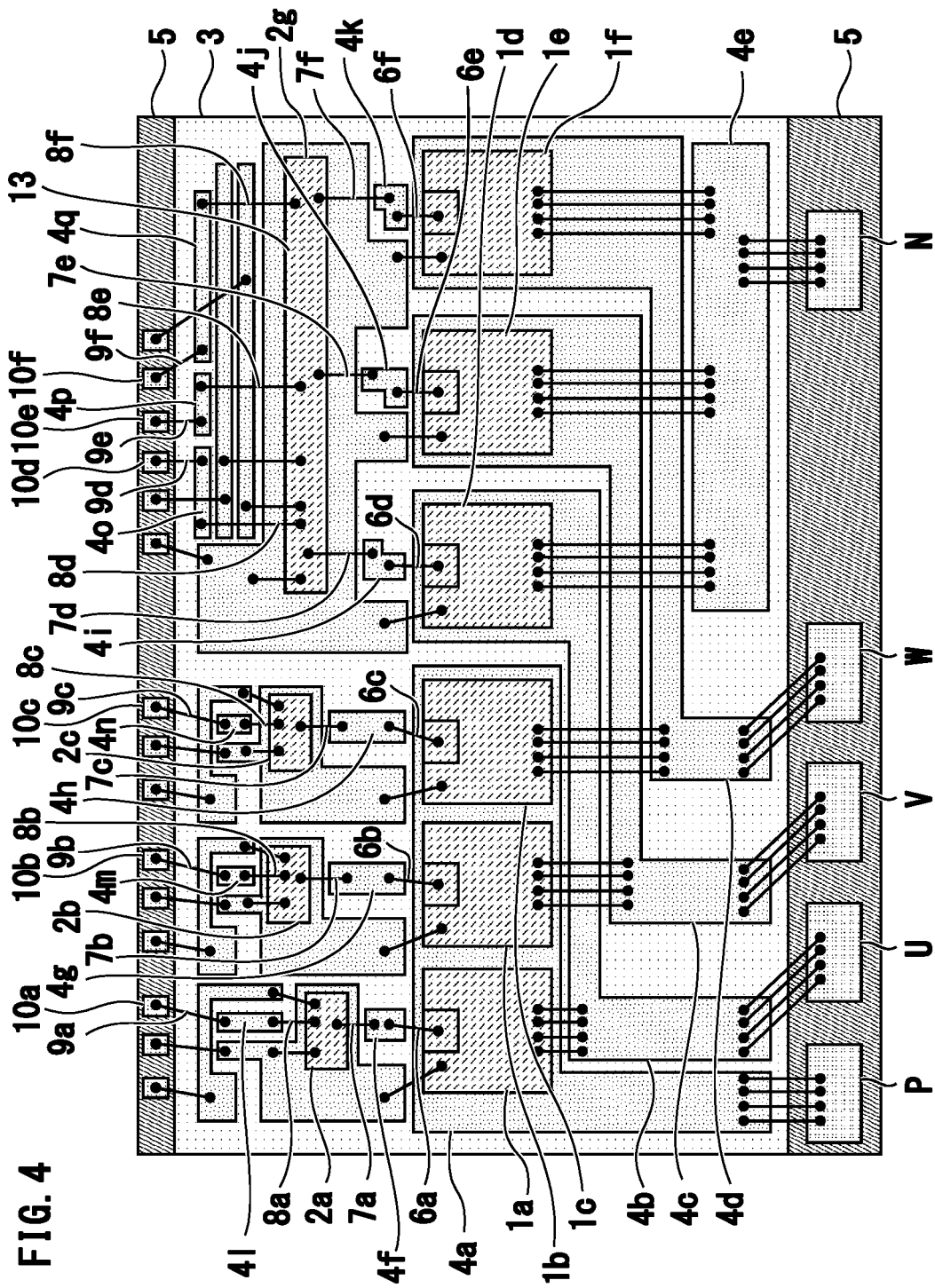
FIG. 4 is a top view illustrating a first modification of the semiconductor apparatus according to the first embodiment.

FIG. 4 is a top view illustrating a first modification of the semiconductor apparatus according to the first embodiment. The three control semiconductor devices 2d to 2f in FIG. 1, which have the same reference potential, are implemented with one chip to constitute one control semiconductor device 2g in FIG. 3. Of the plurality of control semiconductor devices 2a to 2c and 2g arranged in line, the control semiconductor devices 2a and 2g at both ends are arranged closer to the corresponding power semiconductor devices than the control semiconductor devices 2b and 2c other than the control semiconductor devices 2a and 2g at both ends.

Figure 5:
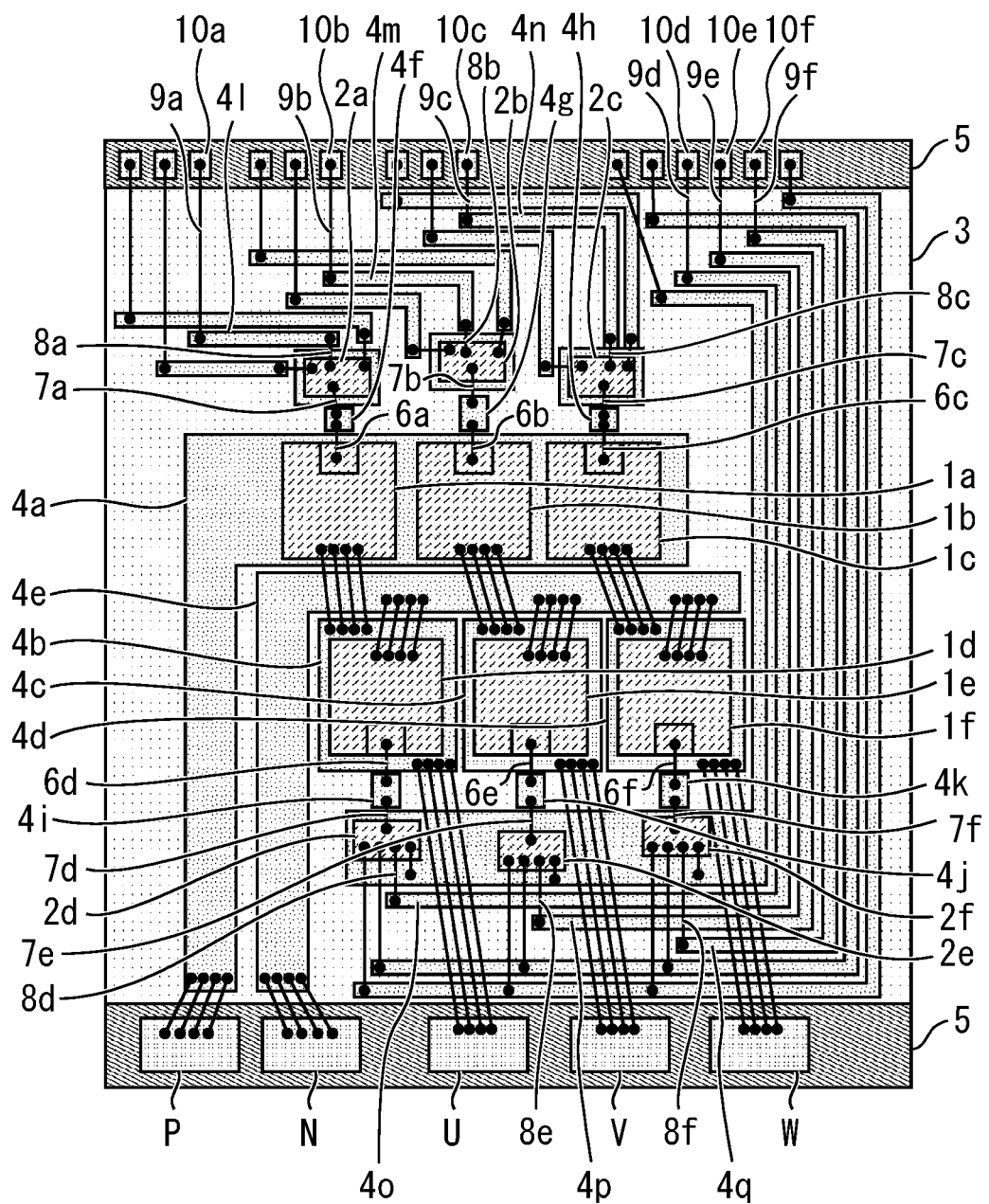
FIG. 5 is a top view illustrating a second modification of the semiconductor apparatus according to the first embodiment.

FIG. 5 is a top view illustrating a second modification of the semiconductor apparatus according to the first embodiment. A line of the high side power semiconductor devices 1a to 1c and a line of the low side power semiconductor devices 1d to 1f are arranged in parallel at the central portion of the insulating substrate 3. The high side control semiconductor devices 2a to 2c and the low side control semiconductor devices 2d to 2f are arranged opposite to each other across the power semiconductor devices 1a to 1f. Of the high side control semiconductor devices 2a to 2c arranged in line, the control semiconductor devices 2a and 2c at both ends are arranged closer to the corresponding power semiconductor devices than the control semiconductor device 2b at the center. In a similar manner, of the low side control semiconductor devices 2d to 2f arranged in line, the control semiconductor devices 2d and 2f at both ends are arranged closer to the corresponding power semiconductor devices than the control semiconductor device 2e at the center.

Figure 6:
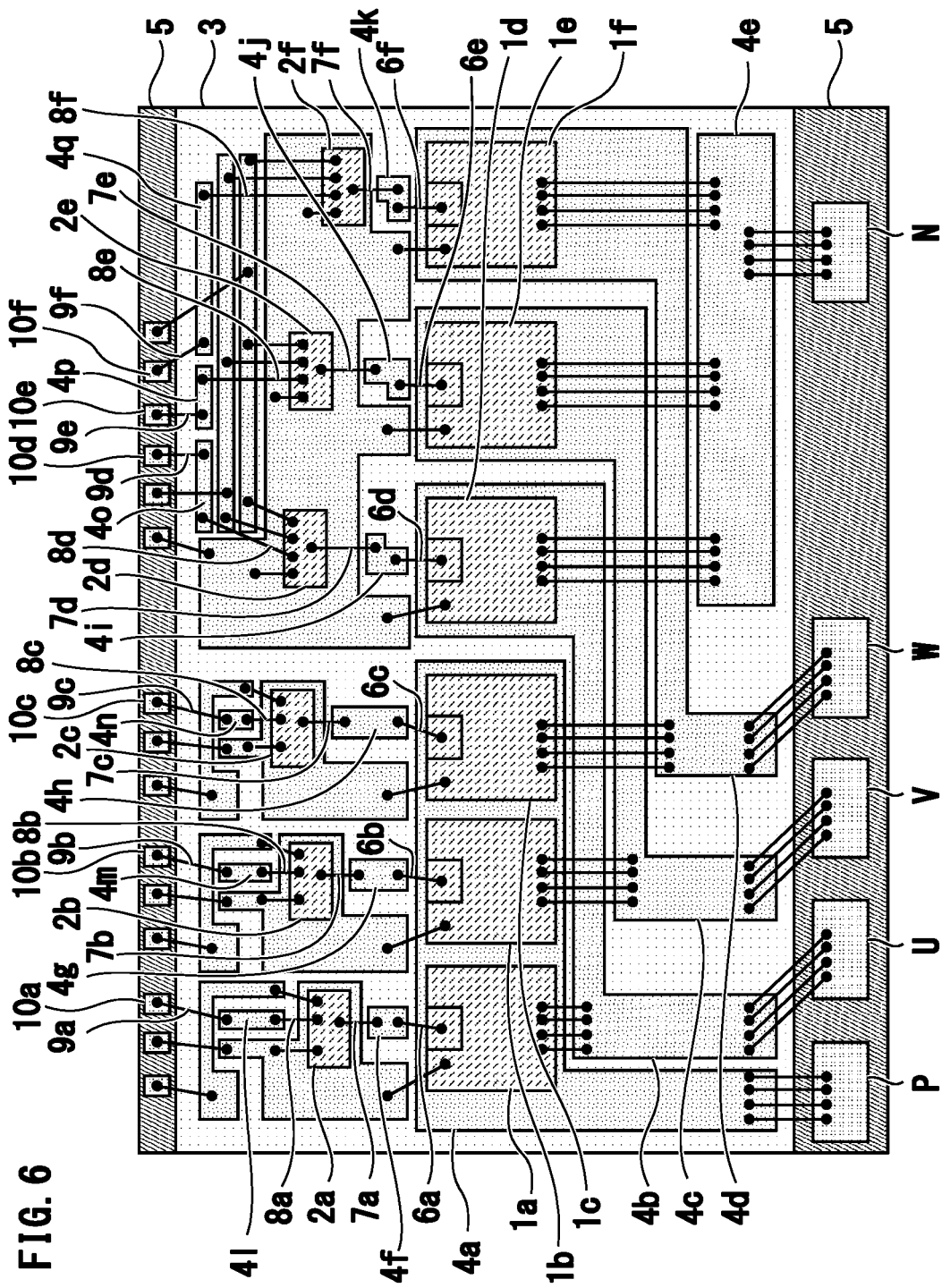
FIG. 6 is a top view illustrating a third modification of the semiconductor apparatus according to the first embodiment.

FIG. 6 is a top view illustrating a third modification of the semiconductor apparatus according to the first embodiment. The control semiconductor device 2d at the center is arranged closer to the corresponding power semiconductor device than the control semiconductor device 2c at the center. Also in a case of these first to third modifications, the above-described effects of the first embodiment can be provided.

Second Embodiment

Figure 7:
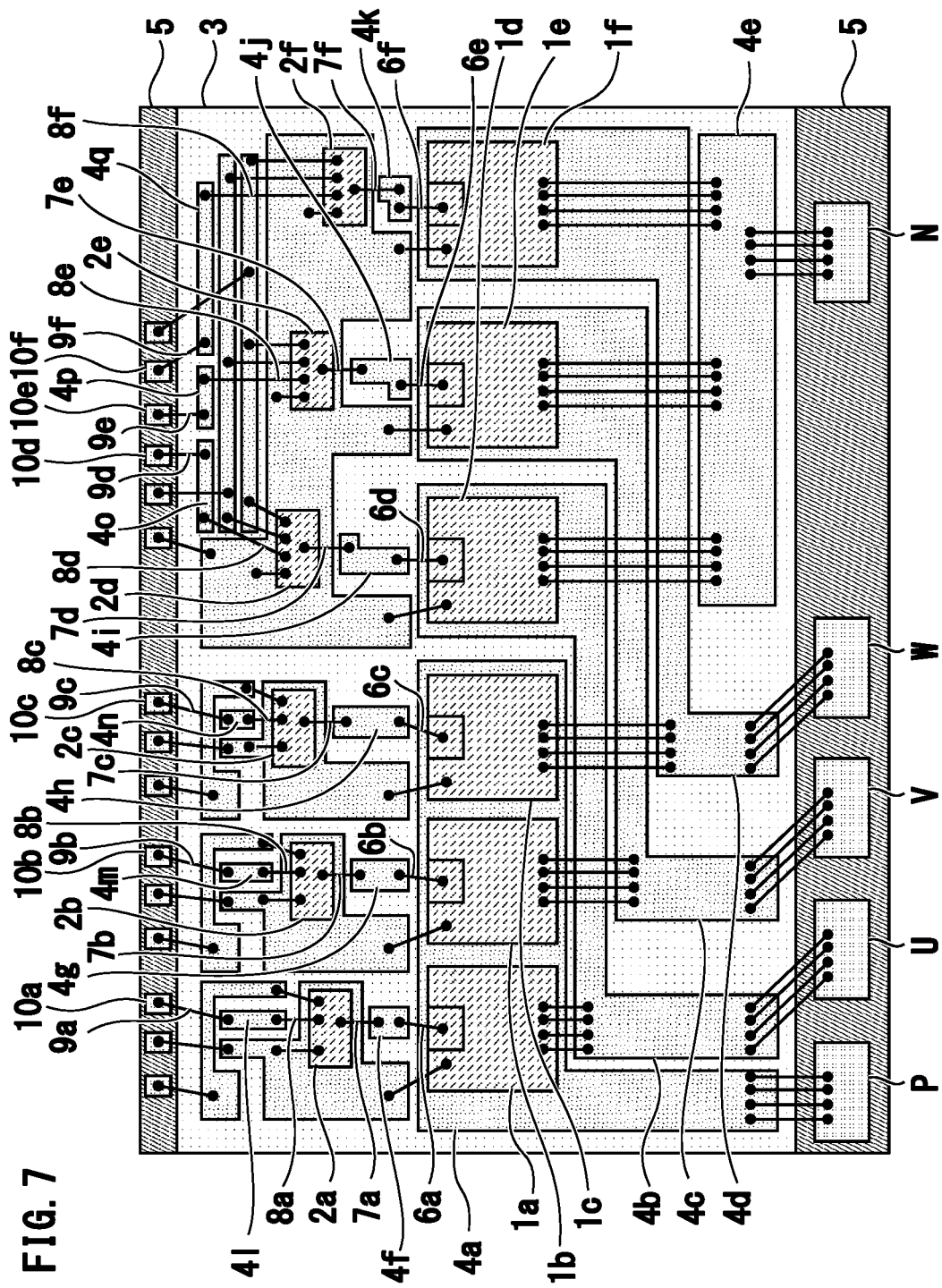
FIG. 7 is a top view illustrating a semiconductor apparatus according to the second embodiment.

FIG. 7 is a top view illustrating a semiconductor apparatus according to the second embodiment. The signal pads of the plurality of power semiconductor devices 1a to 1f are connected to the corresponding control semiconductor devices 2a to 2f with the signal wires 6a to 6f and 7a to 7f and the copper circuit patterns 4f to 4k. A magnitude of signal wiring impedance depends more largely on lengths of the signal wires than on the copper circuit patterns. Thus, in the present embodiment, by adjusting the lengths of the copper circuit patterns 4f to 4k, a total length of the signal wires 6a and 7a, a total length of the signal wires 6b and 7b, a total length of the signal wires 6c and 7c, a total length of the signal wires 6d and 7d, a total length of the signal wires 6e and 7e, and a total length of the signal wires 6f and 7f corresponding to the plurality of power semiconductor devices 1a to 1f are made the same. This can make the signal wiring impedance the same in each phase, so that it is possible to reduce variation in the signal transmission times from the control semiconductor devices 2a to 2f to the power semiconductor devices 1a to 1f and thereby improve controllability of the semiconductor apparatus. Other configurations and effects are similar to those in the first embodiment.

Third Embodiment

Figure 8:
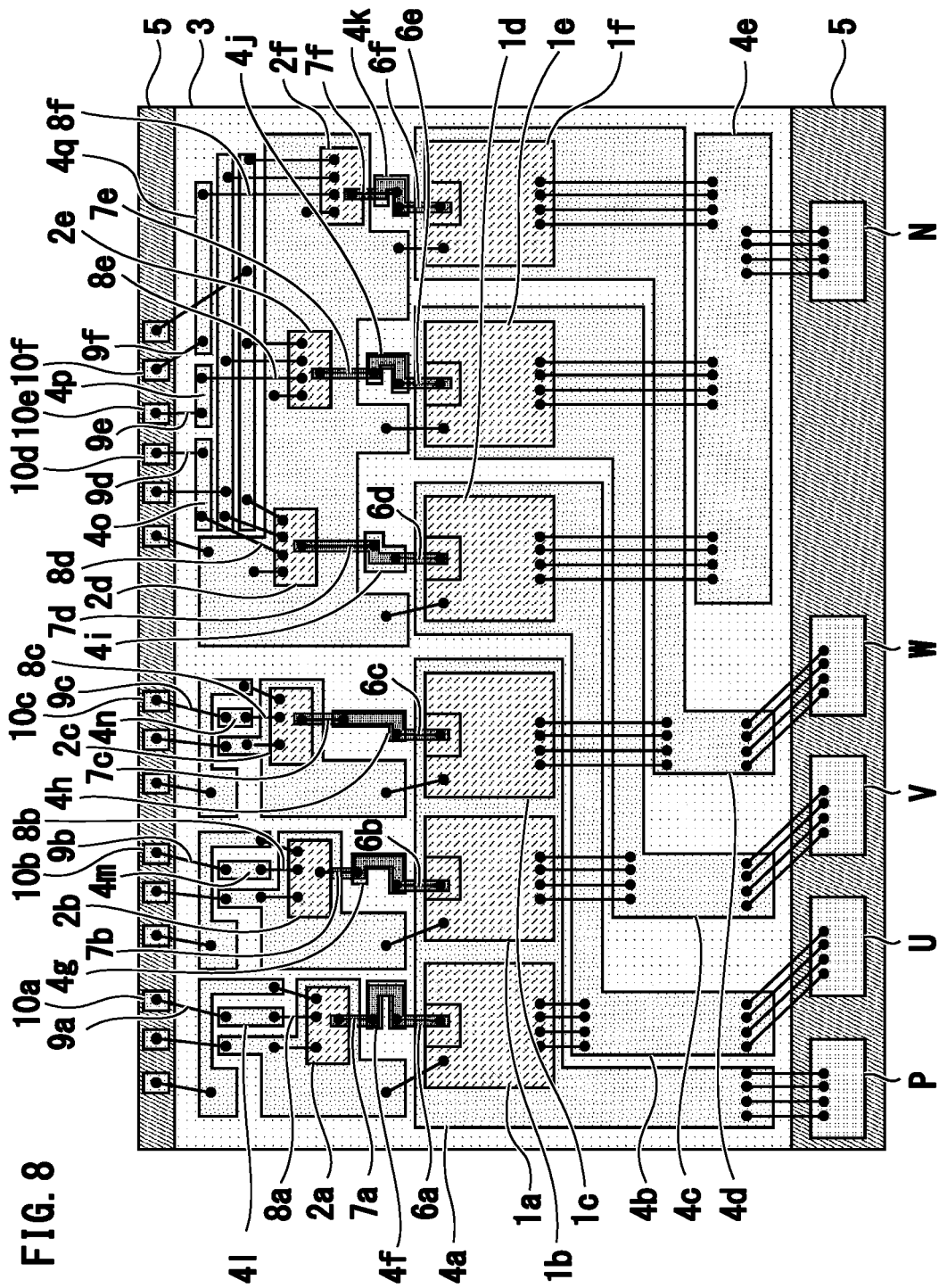
FIG. 8 is a top view illustrating a semiconductor apparatus according to the third embodiment.

FIG. 8 is a top view illustrating a semiconductor apparatus according to the third embodiment. In the present embodiment, a total length of the signal wires 6a and 7a and the copper circuit pattern 4f, a total length of the signal wires 6b and 7b and the copper circuit pattern 4g, a total length of the signal wires 6c and 7c and the copper circuit pattern 4h, a total length of the signal wires 6d and 7d and the copper circuit pattern 4i, a total length of the signal wires 6e and 7e and the copper circuit pattern 4j, and a total length of the signal wires 6f and 7f and the copper circuit pattern 4k corresponding to the plurality of power semiconductor devices 1a to 1f are made the same. This can make the signal wiring impedance the same in each phase, so that it is possible to reduce variation in the signal transmission times from the control semiconductor devices 2a to 2f to the power semiconductor devices 1a to 1f and thereby improve controllability of the semiconductor apparatus. Other configurations and effects are similar to those in the first embodiment.

Fourth Embodiment

Figure 9:
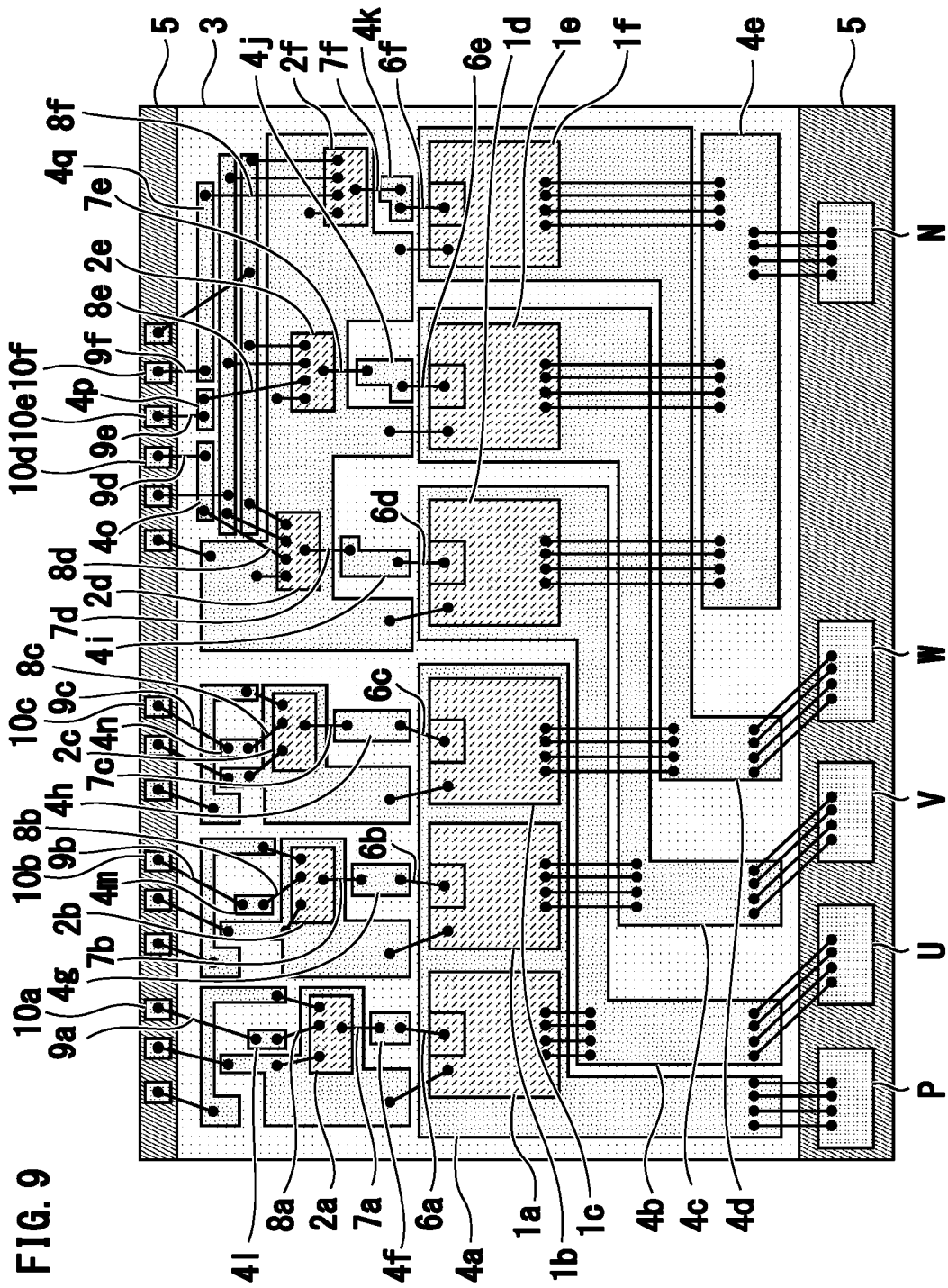
FIG. 9 is a top view illustrating a semiconductor apparatus according to the fourth embodiment.

FIG. 9 is a top view illustrating a semiconductor apparatus according to the fourth embodiment. In the present embodiment, a total length of the signal wires 8a and 9a, a total length of the signal wires 8b and 9b, a total length of the signal wires 8c and 9c, a total length of the signal wires 8d and 9d, a total length of the signal wires 8e and 9e, and a total length of the signal wires 8f and 9f are the same. This can make the signal wiring impedance the same in each phase, so that it is possible to reduce variation in the signal transmission times from the control terminals 10a to 10f to the control semiconductor devices 2a to 2f and thereby improve controllability of the semiconductor apparatus. Other configurations and effects are similar to those in the first embodiment.

Fifth Embodiment

Figure 10:
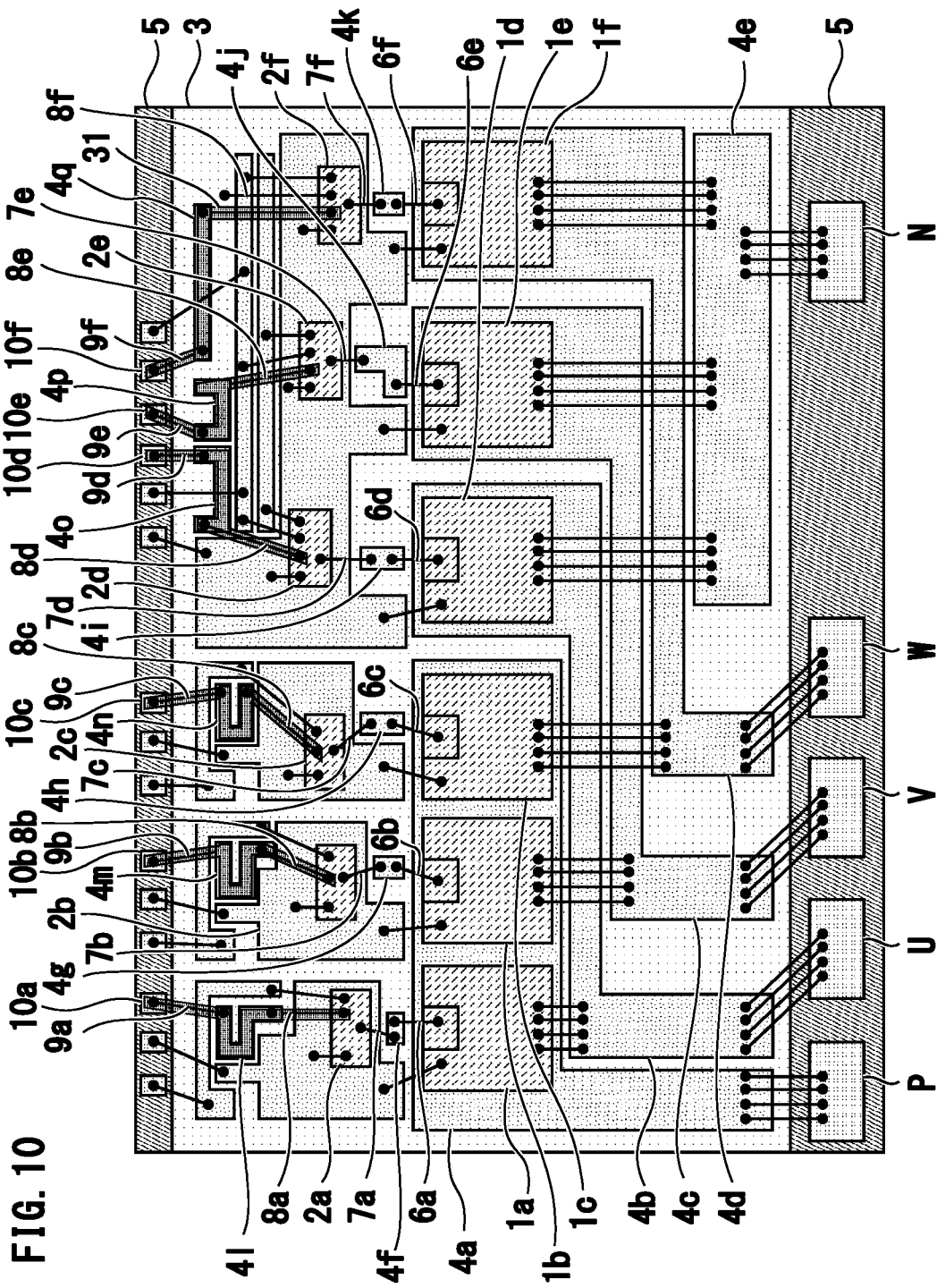
FIG. 10 is a top view illustrating a semiconductor apparatus according to the fifth embodiment.

FIG. 10 is a top view illustrating a semiconductor apparatus according to the fifth embodiment. In the present embodiment, a total length of the signal wire 8a and 9a and the copper circuit pattern 4l, a total length of the signal wires 8b and 9b and the copper circuit pattern 4m, a total length of the signal wire 8c and 9c and the copper circuit pattern 4n, a total length of the signal wires 8d and 9d and the copper circuit pattern 4o, a total length of the signal wires 8e and 9e and the copper circuit pattern 4p, and a total length of the signal wires 8f and 9f and the copper circuit pattern 4q are the same. This can make the signal wiring impedance the same in each phase, so that it is possible to reduce variation in the signal transmission times from the control terminals 10a to 10f to the control semiconductor devices 2a to 2f and thereby improve controllability of the semiconductor apparatus. Other configurations and effects are similar to those in the first embodiment.

The power semiconductor devices 1a to 1f are not limited to semiconductor devices formed of silicon, but instead may be formed of a wide-bandgap semiconductor having a bandgap wider than that of silicon. The wide-bandgap semiconductor is, for example, a silicon carbide, a galliumnitride-based material, or diamond. A semiconductor chip formed of such a wide-bandgap semiconductor has a high voltage resistance and a high allowable current density, and thus can be miniaturized. The use of such a miniaturized semiconductor chip enables the miniaturization and high integration of the semiconductor apparatus in which the semiconductor chip is incorporated. Further, since the semiconductor chip has a high heat resistance, a radiation fin of a heatsink can be miniaturized and a water-cooled part can be air-cooled, which leads to further miniaturization of the semiconductor apparatus. Further, since the semiconductor chip has a low power loss and a high efficiency, a highly efficient semiconductor apparatus can be achieved.

Obviously many modifications and variations of the present disclosure are possible in the light of the above teachings. It is therefore to be understood that within the scope of the appended claims the invention may be practiced otherwise than as specifically described.

The entire disclosure of Japanese Patent Application No. 2021-162546, filed on Oct. 1, 2021 including specification, claims, drawings and summary, on which the convention priority of the present application is based, is incorporated herein by reference in its entirety.

The invention claimed is:

1. A semiconductor apparatus comprising:
   an insulating substrate;
   a plurality of power semiconductor devices arranged in line on the insulating substrate; and
   a plurality of control semiconductor devices arranged in line on the insulating substrate so as to face the plurality of power semiconductor devices respectively and driving the plurality of power semiconductor devices,
   wherein the control semiconductor devices at both ends of the plurality of control semiconductor devices are arranged closer to the corresponding power semiconductor devices facing the control semiconductor devices at both ends of the plurality of control semiconductor devices, compared with distances from the control semiconductor devices which are other than the control semiconductor devices at both ends to the corresponding power semiconductor devices facing the control semiconductor devices which are other than the control semiconductor devices at both ends.

2. The semiconductor apparatus according to claim 1, wherein the control semiconductor devices arranged between the control semiconductor device at the center and the control semiconductor devices at both ends of the plurality of control semiconductor devices arranged in line are arranged closer to the corresponding power semiconductor devices than the control semiconductor device at the center.

3. The semiconductor apparatus according to claim 2, further comprising a plurality of first signal wires connecting signal pads of the power semiconductor devices to the control semiconductor devices respectively,
   wherein lengths of the plurality of first signal wires are the same as each other.

4. The semiconductor apparatus according to claim 3, further comprising a plurality of control terminals inputting control signals from outside, and a plurality of second signal wires connecting the plurality of control terminals to the plurality of control semiconductor devices respectively,
   wherein lengths of the plurality of second signal wires are the same as each other.

5. The semiconductor apparatus according to claim 3, further comprising a plurality of control terminals inputting control signals from outside, and a plurality of second signal wiring parts connecting the plurality of control terminals to the plurality of control semiconductor devices respectively,
   wherein each second signal wiring part includes a signal wire and a circuit pattern, and
   lengths of the plurality of second signal wiring parts are the same as each other.

6. The semiconductor apparatus according to claim 2, further comprising a plurality of first signal wiring parts connecting signal pads of the power semiconductor devices to the control semiconductor devices respectively,
   wherein each first signal wiring part includes a signal wire and a circuit pattern, and
   lengths of the plurality of first signal wiring parts are the same as each other.

7. The semiconductor apparatus according to claim 6, further comprising a plurality of control terminals inputting control signals from outside, and a plurality of second signal wires connecting the plurality of control terminals to the plurality of control semiconductor devices respectively,
   wherein lengths of the plurality of second signal wires are the same as each other.

8. The semiconductor apparatus according to claim 6, further comprising a plurality of control terminals inputting control signals from outside, and a plurality of second signal wiring parts connecting the plurality of control terminals to the plurality of control semiconductor devices respectively,
   wherein each second signal wiring part includes a signal wire and a circuit pattern, and
   lengths of the plurality of second signal wiring parts are the same as each other.

9. The semiconductor apparatus according to claim 2, further comprising a plurality of control terminals inputting control signals from outside, and a plurality of second signal wires connecting the plurality of control terminals to the plurality of control semiconductor devices respectively,
   wherein lengths of the plurality of second signal wires are the same as each other.

10. The semiconductor apparatus according to claim 2, further comprising a plurality of control terminals inputting control signals from outside, and a plurality of second signal wiring parts connecting the plurality of control terminals to the plurality of control semiconductor devices respectively,
    wherein each second signal wiring part includes a signal wire and a circuit pattern, and
    lengths of the plurality of second signal wiring parts are the same as each other.

11. The semiconductor apparatus according to claim 1, further comprising a plurality of first signal wires connecting signal pads of the power semiconductor devices to the control semiconductor devices respectively,
    wherein lengths of the plurality of first signal wires are the same as each other.

12. The semiconductor apparatus according to claim 11, further comprising a plurality of control terminals inputting control signals from outside, and a plurality of second signal wires connecting the plurality of control terminals to the plurality of control semiconductor devices respectively,
    wherein lengths of the plurality of second signal wires are the same as each other.

13. The semiconductor apparatus according to claim 11, further comprising a plurality of control terminals inputting control signals from outside, and a plurality of second signal wiring parts connecting the plurality of control terminals to the plurality of control semiconductor devices respectively,
    wherein each second signal wiring part includes a signal wire and a circuit pattern, and lengths of the plurality of second signal wiring parts are the same as each other.

14. The semiconductor apparatus according to claim 1, further comprising a plurality of first signal wiring parts connecting signal pads of the power semiconductor devices to the control semiconductor devices respectively,
wherein each first signal wiring part includes a signal wire and a circuit pattern, and
lengths of the plurality of first signal wiring parts are the same as each other.

15. The semiconductor apparatus according to claim 14, further comprising a plurality of control terminals inputting control signals from outside, and a plurality of second signal wires connecting the plurality of control terminals to the plurality of control semiconductor devices respectively,
wherein lengths of the plurality of second signal wires are the same as each other.

16. The semiconductor apparatus according to claim 14, further comprising a plurality of control terminals inputting control signals from outside, and a plurality of second signal wiring parts connecting the plurality of control terminals to the plurality of control semiconductor devices respectively,
wherein each second signal wiring part includes a signal wire and a circuit pattern, and
lengths of the plurality of second signal wiring parts are the same as each other.

17. The semiconductor apparatus according to claim 1, further comprising a plurality of control terminals inputting control signals from outside, and a plurality of second signal wires connecting the plurality of control terminals to the plurality of control semiconductor devices respectively,
wherein lengths of the plurality of second signal wires are the same as each other.

18. The semiconductor apparatus according to claim 1, further comprising a plurality of control terminals inputting control signals from outside, and a plurality of second signal wiring parts connecting the plurality of control terminals to the plurality of control semiconductor devices respectively,
wherein each second signal wiring part includes a signal wire and a circuit pattern, and
lengths of the plurality of second signal wiring parts are the same as each other.

19. The semiconductor apparatus according to claim 1, further comprising a circuit pattern provided on the insulating substrate,
wherein the plurality of power semiconductor devices are mounted on the circuit pattern, and
a thickness of the circuit pattern is 0.3 mm or more.

20. The semiconductor apparatus according to claim 1, wherein the plurality of power semiconductor devices are made of a wide-band-gap semiconductor.

* * * * *